(12) United States Patent
Machida et al.

(10) Patent No.: US 8,960,866 B2
(45) Date of Patent: Feb. 24, 2015

(54) ELECTROMECHANICAL TRANSDUCER ELEMENT, LIQUID DISCHARGE HEAD, LIQUID DISCHARGE DEVICE, AND IMAGE FORMING APPARATUS

(71) Applicants: Osamu Machida, Kanagawa (JP); Yoshikazu Akiyama, Kanagawa (JP); Ryo Tashiro, Kanagawa (JP); Akira Shimofuku, Kanagawa (JP); Eiichi Ohta, Kanagawa (JP); Kenichi Ogata, Kanagawa (JP)

(72) Inventors: Osamu Machida, Kanagawa (JP); Yoshikazu Akiyama, Kanagawa (JP); Ryo Tashiro, Kanagawa (JP); Akira Shimofuku, Kanagawa (JP); Eiichi Ohta, Kanagawa (JP); Kenichi Ogata, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 13/737,128

(22) Filed: Jan. 9, 2013

(65) Prior Publication Data

US 2013/0176364 A1 Jul. 11, 2013

(30) Foreign Application Priority Data

Jan. 10, 2012 (JP) ................................ 2012-002524

(51) Int. Cl.
| | | |
|---|---|---|
| B41J 2/045 | (2006.01) | |
| H01L 41/08 | (2006.01) | |
| H01L 41/318 | (2013.01) | |
| H01L 41/331 | (2013.01) | |
| B41J 2/14 | (2006.01) | |

(52) U.S. Cl.
CPC ............. *B41J 2/045* (2013.01); *H01L 41/0805* (2013.01); *H01L 41/318* (2013.01); *H01L 41/331* (2013.01); *B41J 2/14233* (2013.01)
USPC .......................................................... 347/68

(58) Field of Classification Search
None
See application file for complete search history.

(56) References Cited

U.S. PATENT DOCUMENTS

| | | | | |
|---|---|---|---|---|
| 4,303,927 | A * | 12/1981 | Tsao | 347/40 |
| 6,505,919 | B1 | 1/2003 | Mizutani | |
| 6,712,456 | B2 | 3/2004 | Matsuzawa et al. | |
| 7,101,026 | B2 | 9/2006 | Shimada et al. | |
| 2002/0085065 | A1 | 7/2002 | Shimada et al. | |
| 2005/0097716 | A1* | 5/2005 | Takakuwa et al. | 29/25.35 |
| 2008/0018714 | A1* | 1/2008 | Domoto et al. | 347/70 |

(Continued)

FOREIGN PATENT DOCUMENTS

| | | |
|---|---|---|
| JP | 11-129468 | 5/1999 |
| JP | 3019845 | 3/2000 |

(Continued)

OTHER PUBLICATIONS

K. O. Budd, S. K. Dey, D. A. Payne, Proc. Brit. Ceram. Soc. 36, 107 (1985).

(Continued)

*Primary Examiner* — Matthew Luu
*Assistant Examiner* — Erica Lin
(74) *Attorney, Agent, or Firm* — Cooper & Dunham LLP

(57) ABSTRACT

Disclosed is an electromechanical transducer element including a first electrode disposed on a substrate; an electromechanical transducer film disposed on a first portion of the first electrode; and a second electrode disposed on a second portion of the electromechanical transducer film, wherein an actuator portion formed by laminating the substrate, the first electrode, the electromechanical transducer film, and the second electrode has a stiffness such that, in a cross section of the actuator portion, the stiffness gradually increases from an end portion of the actuator portion to a center portion of the actuator portion.

7 Claims, 13 Drawing Sheets

(56) References Cited

U.S. PATENT DOCUMENTS

2008/0018716 A1\* 1/2008 Noguchi et al. ............... 347/71
2010/0132176 A1\* 6/2010 Lee et al. ................. 29/25.35

FOREIGN PATENT DOCUMENTS

| JP | 2000-246888 | 9/2000 |
|---|---|---|
| JP | 2002-103618 | 4/2002 |
| JP | 3636301 | 4/2005 |
| JP | 3725390 | 12/2005 |
| JP | 2008-147682 | 6/2008 |
| JP | 4117504 | 7/2008 |
| JP | 2011-18836 | 1/2011 |
| JP | 2011-108996 | 6/2011 |

OTHER PUBLICATIONS

A. Kumar and G. M. Whitesides, Appl. Phys. Lett., 63, 2002 (1993).

\* cited by examiner

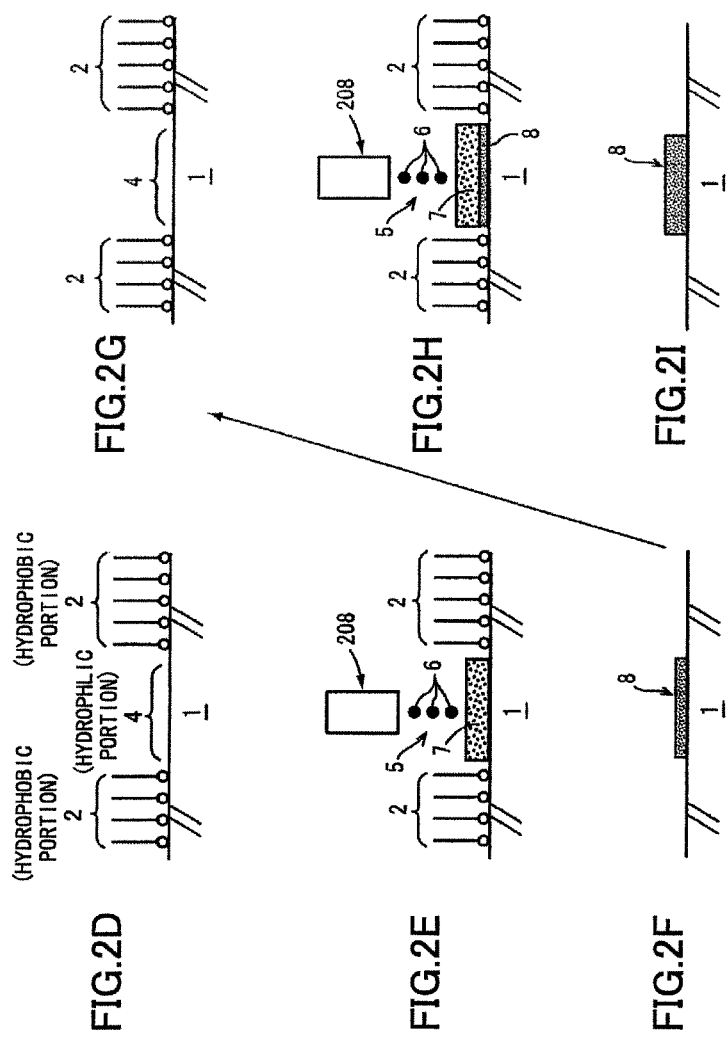

ELECTROMECHANICAL TRANSDUCER ELEMENT, LIQUID DISCHARGE HEAD, LIQUID DISCHARGE DEVICE, AND IMAGE FORMING APPARATUS

BACKGROUND OF THE INVENTION

1. Field of the Invention

Embodiments of the present invention relate to an electromechanical transducer element, a liquid discharge head, a liquid droplet discharge device, and an image forming apparatus. Specifically, the embodiments of the present invention relate to the electromechanical transducer element that may be utilized as a piezoelectric element of the liquid discharge head included in an inkjet recording apparatus that is used as an image forming apparatus, or an image forming apparatus such as a printer, a facsimile machine, a copier, a plotter, and a multifunction peripheral including these functions; the liquid discharge head including the electromechanical transducer element; the liquid droplet discharge device including the liquid discharge head; and an image forming apparatus including the liquid discharge head or the liquid droplet discharge device.

2. Description of the Related Art

In an image recording apparatus, such as a printer, a facsimile machine, or a copier, or an inkjet recording apparatus that is utilized as an image forming apparatus, an image is formed on an object, such as a sheet that can be a recording medium, by discharging ink droplets from a recording head onto the object. The recording head includes a nozzle that discharges ink droplets; a pressurizing chamber (which is also referred to as an ink flow channel, a pressurizing liquid chamber, a pressure chamber, a discharge chamber, and a liquid chamber) that communicates with the nozzle; and an electromechanical transducer element that applies pressure to ink inside the pressurizing chamber, an electrothermal conversion element such as a heater, or an energy generating unit formed of an oscillation plate that forms a wall surface of an ink flow channel and an electrode facing the oscillation plate. The recording head discharges ink droplets through the nozzle by applying pressure to the ink inside the pressurizing chamber by using energy generated by the energy generating unit.

In general, in the recording head, individual piezoelectric elements are disposed in the corresponding pressurizing chambers so as to generate pressure for discharging ink. The piezoelectric element is referred to as the electromechanical transducer elements, in general. The electromechanical transducer element converts an electrical input into a mechanical deformation. The electromechanical transducer element has a layered structure such that a film formed of, for example, a piezoelectric material is disposed between a pair of an upper electrode and a lower electrode. The pair of the upper electrode and the lower electrode is for providing an electrical input. For a piezoelectric material, for example, a lead zirconate titanate ceramic is utilized (hereinafter, abbreviated as "PZT"). Since such a material includes plural metal oxides as main components, in general it is referred to as a complex metal oxide. There are many technical proposals regarding an electromechanical transducer element including such a piezoelectric material (e.g., Patent Documents 1-6).

Patent Document 1 discloses a technique such that a slope is formed on a side surface of a piezoelectric thin film, and thereby dielectric breakdown is prevented. Patent Document 2 discloses a technique such that an electrical resistivity and a dielectric constant are inclined between a lower electrode and an upper electrode in a film thickness of a piezoelectric material, and thereby the electromechanical transducer element can be driven at a low voltage. Patent Document 3 discloses a technique such that Young's modulus of an oscillation plate and stress of each of thin films are defined, thereby forming a structure that efficiently oscillates.

Patent Document 4 discloses a technique such that a lower electrode is not disposed at end portions in a longitudinal direction of a piezoelectric thin film, and the piezoelectric thin film and an upper electrode are directly formed on an oscillation plate, thereby improving rigidity of the oscillation plate. Patent Document 5 discloses a technique such that a compressive film is formed in an oscillation plate disposed below a piezoelectric thin film, thereby reducing an initial bending of the oscillation plate. Patent Document 6 discloses a technique such that a PZT (lead zirconate titanate) film is pattern-formed by a sol-gel method, thereby providing an inkjet actuator. For the patterning, a PZT precursor film is formed by inkjet printing. Namely, a bank is formed at a desired portion, and a precursor liquid is dropped into the bank. Patent Document 6 discloses that, for forming the bank, a silicone nitride based film is formed, and photolithography/etching is applied.

(A Conventional Method of Forming Individual Piezoelectric Elements)

A conventional method of forming individual piezoelectric elements will be explained below. A film is laminated on a lower electrode by a known film forming technique, such as a vacuum film formation method (e.g., a sputtering method, a MO-CVD method (chemical vapor deposition using a metal organic compound), a vacuum deposition method, and an ion-plating method), a sol-gel method, a hydrothermal synthesis method, an aerosol deposition method (hereinafter, abbreviated as "the AD method"), a coating and thermal deposition method (Metal Organic Deposition (MOD)). Subsequently, an upper electrode is formed, and patterning is performed to the upper electrode by photolithography/etching. Similarly, the patterning is performed to a piezoelectric film and to a lower electrode, and thereby piezoelectric elements are individualized.

A metal complex oxide, especially the PZT is a material to which dry etching is not easily applied. A Si semiconductor device can be easily etch-processed by applying reactive ion etching (RIE). For such a material (metal complex oxides such as the PZT), a special RIE is applied, where ICP plasma, ECR plasma, and helicon plasma are concurrently utilized, so as to increase plasma energy of ion species. However, this can increase the cost of the manufacturing apparatus. Further, it is difficult to improve a selection ratio between the metal complex oxide and a base electrode film. Especially, for a substrate having a large area, unevenness of the etching speed can be a major obstacle for forming a film. The above-described process can be omitted by disposing a PZT film, which is difficult to be etched, at a desired portion. However, such an attempt has not been made, except for few exceptions.

(Cross-Sectional Shape of Conventional Piezoelectric Thin Film)

Next, a cross-sectional shape of a conventional piezoelectric thin film will be explained. In a conventional method of forming the piezoelectric thin film, the piezoelectric thin film is formed over an entirety of a substrate. Subsequently, a required pattern is formed by the dry etching. Therefore, a film thickness of each of the obtained individual piezoelectric thin films is constant over the same substrate. The piezoelectric thin film is required to be efficiently deformed, so that the piezoelectric thin film applies pressure to ink inside a pressurizing chamber, which is formed below the piezoelectric thin film. However, for the conventional piezoelectric thin film, since the film thickness is constant, the deformation of the piezoelectric thin film is suppressed at edge portions of the pressurizing chamber by the piezoelectric thin film itself.

(Conventional Examples of Forming Individual PZT Films)

Next, the hydrothermal synthesis method, the vacuum deposition method, the AD method, and the sol-gel method will be explained as conventional examples of forming the individual PZT films. The hydrothermal synthesis method is a method where the PZT is selectively developed on a Ti metal. When a Ti electrode is patterned, the PZT films grow only on the patterned portions. In order to obtain the PZT film having a sufficient pressure-resistant property by the hydrothermal synthesis method, the film is preferably a relatively thick film having a thickness of greater than or equal to 5 μm (if the film thickness is less than 5 μm, the film is easily damaged by the dielectric breakdown). Therefore, it is difficult to obtain a film having an arbitrary thickness. Further, since the hydrothermal synthesis is performed in a strong alkaline water solution, when the piezoelectric elements are formed on a Si substrate, the Si substrate is protected.

The vacuum deposition method is used for manufacturing an organic electroluminescence display, for example. In this case, a shadow mask is utilized, and for patterning of a luminous layer, the vacuum deposition method is utilized. In the vacuum deposition method, the PZT film is formed while a temperature of a substrate is maintained in a range from 500 degrees Celsius to 600 degrees Celsius. When the metal complex oxide is crystallized, the metal complex oxide exhibits a piezoelectric property. Therefore, in order to obtain the crystallized film, the substrate is maintained to be in the above-described range. A normal shadow mask is formed of a stainless steel. In this case, sufficient masking may not be formed due to a difference between thermal expansion coefficients of the Si substrate and the stainless steel. On the other hand, the possibility of a disposable shadow mask is low. The MO-CVD method and the sputtering method are not suitable for forming individual piezoelectric films due to a large wrap-around phenomenon of the deposited films.

As the AD method, a method has been known in which a resist pattern is formed by the photolithography in advance, and the PZT film is formed at a portion where the resist pattern is not formed. Similar to the case of the hydrothermal synthesis method, the AD method is advantageous for forming a thick film. The AD method is not suitable for forming a thin film of less than or equal to 5 μm. The PZT film is also deposited on a resist film. Therefore, a lift-off process is performed after a portion of the deposited film has been removed by a polishing process. Since a uniform polishing process of a large area is complicated and the resist film does not have a heat-resisting property, a film is formed by the AD method at room temperature, and the formed film is converted into a film which exhibits the piezoelectric property through a post-annealing treatment.

As the sol-gel method, Patent Document 6 proposes an example of a method in which the PZT precursor solution is applied by the inkjet method (liquid droplet discharge method). However, since a viscosity of the PZT precursor solution that has been applied by the inkjet method is low, the PZT precursor solution spreads on platinum, which is to be a substrate. Further, when a large amount of PZT precursor solution is applied at once, an edge at an outer peripheral portion of a pattern rises and a central portion becomes thin. Therefore, the sol-gel method is not suitable for obtaining a thick film.

Non-Patent Document 1 discloses a technique related to forming a thin film of a metal complex oxide by the sol-gel method. Further, Non-Patent Document 2 discloses that a self assembled monolayer (SAM) film of alkanethiol can be formed on a film of Au. Non-Patent Document 2 discloses that the SAM pattern is transferred by the micro-contact printing method in which this phenomenon is used, and the SAM pattern is utilized for a subsequent process, such as an etching process.

Patent Document 1: Japanese Registered Patent No. 4117504
Patent Document 2: Japanese Patent Laid-Open Application No. 2008-147682
Patent Document 3: Japanese Registered Patent No. 3725390
Patent Document 4: Japanese Registered Patent No. 3636301
Patent Document 5: Japanese Registered Patent No. 3019845
Patent Document 6: Japanese Patent Laid-Open Application No. 2011-108836
Non-Patent Document 1: K. D. Budd, S. K. Dey, D. A. Payne, Proc. Brit. Ceram. Soc. 36, 107 (1985).
Non-Patent Document 2: A. Kumar and G. M. Whitesides, Appl. Phys. Lett., 63, 2002 (1993).

SUMMARY OF THE INVENTION

Conventional techniques of forming electromechanical transducer elements including those disclosed in Patent Documents 1-6 have been focused on uniformly forming an electromechanical transducer film such as a piezoelectric material included in an electromechanical transducer element, so that an efficient oscillation property and an efficient deformation property can be obtained. Therefore, there has not been found any serious technical proposal on a relationship between a stiffness and a film thickness/shape of the electromechanical transducer element (hereinafter, referred to as the "correlation") for obtaining an efficient deformation property.

As described in the embodiments below, the inventors of the present invention have found during research that there is a correlation between the stiffness and the film thickness/shape, as alternative characteristics of an amount of displacement which indicates electromechanical transducing capability of an actuator unit of the electromechanical transducer element. The embodiments of the present invention have been developed in view of the above-described circumstances and problems. An objective of the embodiments of the present invention is to realize and provide an electromechanical transducer element having an efficient deformation property by defining and realizing a stiffness characteristic of the actuator unit of the electromechanical transducer element.

In one aspect of the present invention, there is provided an electromechanical transducer element including
a first electrode disposed on a substrate;
an electromechanical transducer film disposed on a first portion of the first electrode; and
a second electrode disposed on a second portion of the electromechanical transducer film,
wherein an actuator portion formed by laminating the substrate, the first electrode, the electromechanical transducer film, and the second electrode has a stiffness such that, in a cross section of the actuator portion, the stiffness gradually increases from an end portion of the actuator portion to a center portion of the actuator portion.

In another aspect of the present invention, there is provided a liquid discharge head including an electromechanical transducer element, the electromechanical transducer element including
a first electrode disposed on a substrate;
an electromechanical transducer film disposed on a first portion of the first electrode; and a second electrode disposed on a second portion of the electromechanical transducer film, wherein an actuator portion formed by laminating the substrate, the first electrode, the electromechanical transducer film, and the second electrode has a stiffness such that, in a cross section of the actuator portion, the stiffness gradually increases from an end portion of the actuator portion to a center portion of the actuator portion.

In another aspect of the present invention, there is provided a liquid droplet discharge device including a liquid discharge head; and a tank configured to store a liquid to be supplied to the liquid discharge head, wherein the liquid discharge head includes an electromechanical transducer element, wherein the electromechanical transducer element includes a first electrode disposed on a substrate;

an electromechanical transducer film disposed on a first portion of the first electrode; and a second electrode disposed on a second portion of the electromechanical transducer film, wherein an actuator portion formed by laminating the substrate, the first electrode, the electromechanical transducer film, and the second electrode has a stiffness such that, in a cross section of the actuator portion, the stiffness gradually increases from an end portion of the actuator portion to a center portion of the actuator portion.

In another aspect of the present invention, there is provided an image forming apparatus including a liquid discharge head including an electromechanical transducer element, wherein the electromechanical transducer element includes a first electrode disposed on a substrate;

an electromechanical transducer film disposed on a first portion of the first electrode; and a second electrode disposed on a second portion of the electromechanical transducer film, wherein an actuator portion formed by laminating the substrate, the first electrode, the electromechanical transducer film, and the second electrode has a stiffness such that, in a cross section of the actuator portion, the stiffness gradually increases from an end portion of the actuator portion to a center portion of the actuator portion.

In another aspect of the present invention, there is provided an electromechanical transducer element including a first electrode disposed on a substrate;

an electromechanical, transducer film disposed on a first portion of the first electrode; and a second electrode disposed on a second portion of the electromechanical transducer film, wherein the electromechanical transducer film has a thickness such that, in a cross section of an actuator portion formed by laminating the substrate, the first electrode, the electromechanical transducer film, and the second electrode, the thickness gradually increases from an end portion of the actuator portion to a center portion of the actuator portion.

According to the embodiments of the present invention, a novel electromechanical transducer film can be provided with which the above-described problems can be solved and the object can be achieved. Namely, the electromechanical transducer elements having the configurations according to the embodiments of the present invention exhibit efficient deformation properties.

Other objects, features and advantages of the present invention will become more apparent from the following detailed description when read in conjunction with the accompanying drawings.

BRIEF DESCRIPTION OF THE DRAWINGS

FIGS. 2D-2I are schematic cross-sectional views illustrating a coating process after the process of FIGS. 1A-1D, and a drying/thermally decomposing/crystallizing process after the coating process;

DETAILED DESCRIPTION OF THE PREFERRED EMBODIMENTS

Figure 1A:
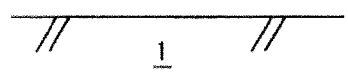
FIG. 1A-1D are schematic cross-sectional views illustrating a surface modification process of an electromechanical transducer film forming method according to a first embodiment of the present invention.

Hereinafter, the embodiments of the present invention will be explained in detail by referring to the accompanying drawings. In the embodiments, the same numerical references are attached to elements such as members and/or components having the same functions and/or the same shapes, provided that they are identified to have the same functions and/or the same shapes, thereby avoiding duplicated explanations.

Hereinafter, an "image forming apparatus" based on a liquid-discharge recording method is an image forming apparatus that forms an image by causing liquid droplets to be adhered to a medium, such as a sheet of paper, a line, a fiber, a fabric, a leather, a metal, a plastic, a glass, a timber, or a ceramic. Further, "image formation" means not only to add an image having a meaning, such as a character or a graphic, to a medium, but also to add an image having no meaning, such as a pattern, to a medium (simply, to cause the liquid droplets to be adhered to the medium). Further, "the liquid droplets" are not limited to ink droplets. For example, the liquid droplets may be droplets of a recording liquid, a fixing process liquid, a resin, and a solution. The liquid droplets are used as a generic term referring to all liquids that can be made to be liquid droplets by granulating, so that an image can be formed. Further, a material of the "recording medium" is not limited to the paper, the material of the recording medium may be a transparency or the cloth. The recording medium means something to which the liquid droplets are adhered. The recording medium is used as a generic term referring to, for example, a medium to be recorded, a recording paper, a paper for recording, a sheet of paper whose thickness is in a range from a thickness of a usable thin paper to a thickness of a usable thick paper, a postcard, an envelope, and a sheet. Further, an image is not limited to a two-dimensional image. The image may be a three-dimensional image.

The embodiments of the present invention are for a Liquid discharge head, which is also referred to as the liquid droplet discharge head, and an image forming apparatus including the liquid discharge head. In general, the image forming apparatus is referred to as an inkjet recording apparatus. Therefore, the image forming apparatus is referred to as the inkjet recording apparatus, hereinafter. The inkjet recording apparatus has many advantages. For example, the inkjet recording apparatus generates very small noise, the inkjet recording apparatus enables high-speed printing, and the inkjet recording apparatus has certain degrees of freedom on the choice of ink, so that a normal sheet of paper, which is less expensive, can be used for the inkjet recording apparatus. Therefore, the inkjet recording apparatuses are widely adopted as an image recording apparatus or an image forming apparatus, such as a multifunctional peripheral including plural image forming functions such as a printer function, a facsimile function, a copy function, and a plot function.

A liquid droplet discharge device, which is used for the inkjet recording apparatus, includes a nozzle for discharging ink droplets; a liquid chamber (which is also referred to as a discharge chamber, a pressurizing chamber, a pressure chamber, or an ink flow channel) that communicates with the nozzle; and a pressure generating unit for discharging ink inside the liquid chamber. Examples of the pressure generating unit include a piezoelectric type pressure generating unit that discharges ink droplets by deforming an oscillation plate, which forms a wall surface of the liquid chamber, by using an electromechanical transducer element such as a piezoelectric element, and a bubble type (thermal type) pressure generating unit that discharges ink droplets by generating bubbles by film boiling of ink by using an electrothermal conversion element such as a heat element disposed in the liquid chamber. Further, examples of the piezoelectric type pressure generating unit include a longitudinal vibration type that utilizes deformation in the $d_{33}$ direction, a transverse vibration type (bend mode type) that utilizes deformation in the $d_{31}$ direction, and a shear mode type that utilizes shear deformation. For the piezoelectric type pressure generating unit, due to the recent progress of semiconductor processing technology and the recent progress in the field of Micro Electro Mechanical Systems (MEMS), a thin film actuator has been developed where a liquid chamber and a piezoelectric element are directly formed on a Si substrate. The electromechanical transducer elements according to the embodiments, which function as pressure generating units, are the transverse vibration type (bend mode type) electromechanical transducer elements that utilize deformation in the $d_{31}$ direction.

First, there will be explained a method of forming a patterned electromechanical transducer film (layer) according to the sol-gel method. The patterned electromechanical transducer film is the basis of the electromechanical transducer elements according to the embodiments.

(1) A base substrate is divided into a portion where a sol-gel liquid (hereinafter, the sol-gel liquid is referred to as the "PZT precursor solution") is applied and the other portion where the PZT precursor solution is not applied, by controlling wettability of a base substrate by the sol-gel method. This is a phenomenon where alkanethiol self-assembles on a specific metal, which has been described in Non-Patent Document 2.

(2) A self-assembled monolayer film (hereinafter, denoted as the "SAM film") is formed on a platinum group metal.

(3) Platinum (Pt) is utilized for a lower electrode as a first electrode, and a process of forming a SAM film performed on the whole surface of the first electrode. Since alkyl groups are disposed on the SAM film, the first electrode becomes hydrophobic.

(4) The SAM film is patterned by the known photolithography/etching.

(5) Since the patterned SAM film is remaining on the first electrode after removing the resist, the portion of the patterned SAM film is hydrophobic. On the other hand, since the other portion of the first electrode, where the SAM film has been removed, is a surface of platinum, it is hydrophilic.

The processes (1)-(5) correspond to a surface modification process where the surface of the lower electrode as the first electrode is partially modified.

(6) The PZT precursor solution (the sol-gel liquid) is applied to a hydrophilic area by an inkjet method, which is an example of the liquid droplet discharge method. By the contrast of the surface energy, the PZT precursor solution is applied only to the hydrophilic area. A viscosity and surface tension of the PZT precursor solution are adjusted, so that the PZT precursor solution can be applied by a liquid discharge head (hereinafter, the liquid discharge head is also referred to as "the inkjet head"). The process (6) corresponds to a coating process where the hydrophilic area on the lower electrode, whose surface has been modified, is partially coated with the PZT precursor solution (the sol-gel liquid).

In this manner, a first patterned PZT precursor film is formed on the base substrate by the inkjet method, and a heating process is performed in accordance with a normal sol-gel process. The process for the second time and the subsequent processes can be simplified for the following reason. The SAM film is not formed on a thin film of an oxide. Therefore, the SAM film is formed only on an exposed platinum film where the PZT film has not been formed by the treatment process (1). After the process of forming a SAM film has been performed on the first patterned base substrate, the first patterned base substrate is divided into a portion where the PZT precursor solution is applied and the other portion where the PZT precursor solution is not applied. Subsequently, a thermal process is applied to the base substrate. The processes after the coating process correspond to a drying/thermally decomposing/crystallizing process for drying, thermally decomposing, and crystallizing the sol-gel liquid which has been partially applied to the base substrate by the coating process.

(7) The above-described coating process and the drying/thermally decomposing/crystallizing process are repeated until the film thickness becomes a desired thickness. With this method of forming the patterned electromechanical transducer film, a ceramic film having a thickness of up to 5 µm can be formed. Namely, according to the embodiments, the PZT precursor solution (the sol-gel liquid) is applied by the inkjet method. For the case of the inkjet method, the amount of the material to be used is reduced compared to a case where the PZT precursor solution is applied by a spin coater in accordance with a conventional spin coating method. Further, with the inkjet method, the process can be significantly simplified compared to the conventional spin coating method. After the coating, the pattern formed by the inkjet method is in a liquid state. Therefore, after the pattern has been dried, the film thickness is such that the cross-section of the actuator portion has a shape of a meniscus (crescent-shaped) convex lens where the film thickness gradually increases from an end portion of the actuator portion to a center portion of the actuator portion (here, the meniscus convex lens shape is such that the convex portion is directed toward the side of the upper electrode, which is disposed at the opposite side of the lower electrode).

The first through fifth embodiments will be explained below by referring to the figures.

First Embodiment

Figure 1B:
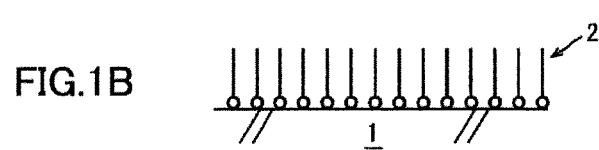

Hereinafter, there will be explained a method of forming (manufacturing) an electromechanical transducer film of an electromechanical transducer element based on the sol-gel method. FIGS. 1A-1D are schematic cross-sectional views illustrating a surface modification process of partially modifying a surface of a substrate 1. Referring to FIG. 1A, on the substrate 1, for example, a platinum (Pt) electrode (not shown) as the first electrode or the lower electrode has been formed on the surface of the substrate 1 by the sputtering method. FIG. 1B shows a state where a SAM film 2 is formed on the whole surface of the substrate 1. The SAM film 2 has been obtained by causing alkanethiol to be self-assembled by dipping the substrate 1 into an alkanethiol liquid. Here, $CH_3$—$(CH_2)$—SH has been used.

Figure 1C:
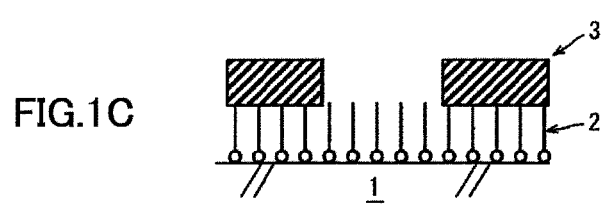
Figure 1D:
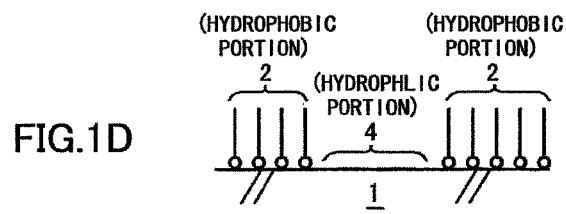

FIG. 1C shows a state where a photoresist layer 3 has been patterned by the photolithography, so as to remove a portion of the SAM film 2 covering an area where a PZT precursor is to be formed, and to protect a necessary portion of the SAM film 2. The portion of the SAM film 2 covering the area where the PZT precursor is to be formed can be removed, for example, by irradiating oxygen plasma onto the surface of the substrate 1 in the state shown in FIG. 1C. FIG. 1D shows a state where the photoresist layer 3 has been removed after removing the SAM film 2. The contact angle of purified water on the SAM film 2 which has been formed by this process is 92 degrees. Thus, the SAM film 2 is hydrophobic (water-repellent). On the other hand, the contact angle of purified water on platinum disposed on the substrate 1, which corresponds to the area from which the portion of the SAM film 2 has been removed, is 54 degrees. Thus, the area is hydrophilic. Hereinafter, in the process shown in FIG. 10 and in the subsequent processes, the area where the SAM film 2 has been formed is indicated by putting "HYDROPHOBIC PORTION" in brackets, and a Pt surface area on the substrate 1 is indicated by putting "HYDROPHILIC PORTION" in brackets. The Pt surface area is the area from which the portion of the SAM film 2 has been removed. In the first embodiment, the example has been explained where the SAM film 2 has been removed by oxygen plasma. However, the first embodiment is not limited to this. For example, the SAM film 2 may be partially removed by irradiating UV light (ultraviolet light).

Next, there will be explained a coating process and a coating method for coating a hydrophilic portion 4 on the substrate 1 with the PZT precursor solution by the inkjet method by referring to FIGS. 2D-2I. Here, the hydrophilic portion 4 has been formed on the substrate 1 by the surface modification process of FIGS. 1A-1D. In the explanation below, the sol-gel liquid is also referred to as the "PZT precursor liquid" or the "PZT precursor solution." The process shown in FIG. 2D and the process shown in FIG. 1D are intentionally overlapped in order to facilitate understanding of the process shown in FIG. 10 and the subsequent processes. As shown in FIG. 2E, a desired pattern area of the hydrophilic portion 4 on the Pt surface on the substrate 1 is coated with the PZT precursor solution 5 by adhering liquid droplets 6 of the PZT precursor solution 5 to the desired pattern area of the hydrophilic portion 4 by using a liquid droplet coating apparatus including a liquid discharge head 208 (described later) shown in FIG. 3. Here, the patterning has been performed on the substrate 1 by the surface modification process shown in FIGS. 1A-1D.

Figure 3:
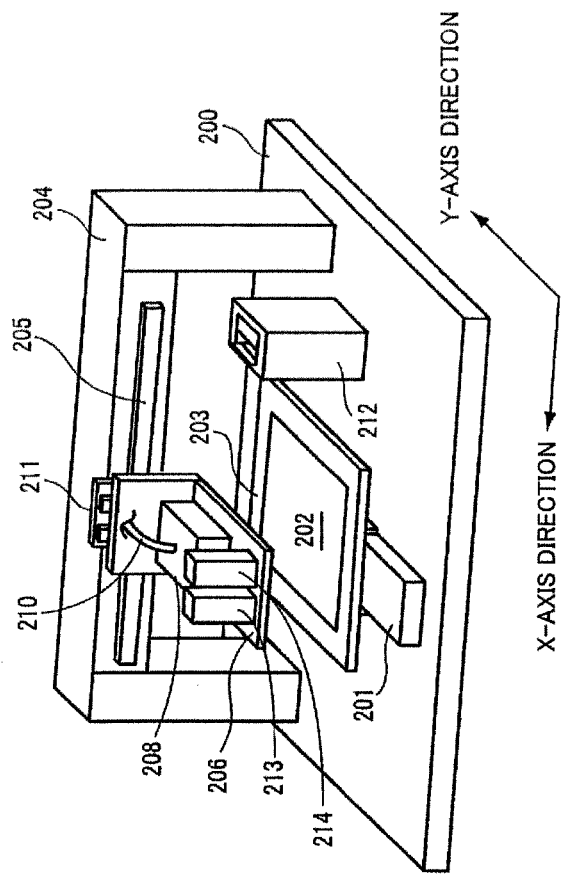
FIG. 3 is a perspective view illustrating a liquid droplet coating apparatus.

Hereinafter, the liquid droplet coating apparatus including the liquid discharge head 208 will be explained by referring to FIG. 3. FIG. 3 is a perspective view illustrating the liquid droplet coating apparatus including the liquid discharge head 208. As shown in FIG. 3, a Y-axis driving unit 201 is disposed on a table 200. A stage 203 for mounting a substrate 202 is disposed on the Y-axis driving unit 201, so that the stage 203 can be driven in a Y-axis direction. Though it is not shown in FIG. 2, the stage 203 includes a suction unit using vacuum or static electricity, and thereby the substrate 202 is fixed to the stage 203.

Further, an X-axis driving unit 205 is attached to an X-axis supporting member 204. A head base 206 mounted on a Z-axis driving unit 211 is attached to the X-axis driving unit 205, and thereby the head base 206 can be moved in an X-axis direction. The liquid droplet discharge head (liquid discharge head) 208 for discharging the PZT precursor solution is mounted on the head base 206. The PZT precursor solution is supplied from a tank for storing the PZT precursor solution (not shown) to the liquid droplet discharge head 208 through a pipe for supplying the PIT precursor solution 210. In FIG. 3, the reference numeral 212 indicates a head waiting position, the reference numeral 213 indicates a first alignment camera for positioning, and the reference numeral 214 indicates a second alignment camera for positioning.

For the PZT precursor solution (the sol-gel liquid) 5, lead acetate trihydrate, titanium isopropoxide, and zirconium isopropoxide were utilized as starting materials. The crystal water of lead acetate was dehydrated after being dissolved in methoxyethanol. The amount of lead was adjusted to exceed the amount of lead defined by the stoichiometric composition by 10 mol %. This was for preventing a so-called "degradation of crystallinity caused by insufficient lead" during a heating process. A PZT precursor solution 5 was synthesized as follows. First, titanium isopropoxide and zirconium isopropoxide were dissolved into methoxyethanol. Then the alcohol exchange reaction and the esterification reaction were accelerated. The PZT precursor solution was synthesized by mixing the resultant solution with the above methoxyethanol solution, in which lead acetate was dissolved. The molar concentration of the PZT of the PZT precursor solution 5 was adjusted to be 0.1 mol/L.

The film thickness formed by a single film forming process is preferably 100 nm. The concentration of the PZT of the PZT precursor solution 5 is adjusted based on a relationship between a film formation area and a coating amount of the PZT precursor solution 5. FIG. 2E shows a state where the PZT precursor solution 5 is applied by the liquid droplet coating apparatus shown in FIG. 3. The PZT precursor solution 5 spreads only over the hydrophilic portion 4 due to the contrast between the contact angles, thereby forming a pattern of a PZT precursor film 7. As a first heating process (solvent drying process), the pattern of the PZT precursor film 7 was heated at 120 degrees Celsius. Subsequently, organic materials were thermally decomposed, and thereby a PZT film 8 as the electromechanical transducer film was obtained as shown in FIG. 2F. At this time, the film thickness was 90 nm.

Subsequently, the substrate 1 was washed with isopropyl alcohol, and the SAM film 2 was formed by a similar dipping process. The SAM film 2 is not formed on an oxide film in the process for the second time and in the subsequent processes. Therefore, as shown in FIG. 2G, the pattern of the SAM film 2 can be obtained without performing the photolithography. At this time, the contact angle of purified water on the SAM film 2 was 92 degrees, and the contact angle of purified water on the PZT film 8 was 34 degrees. FIG. 2H shows a state where positioning had been performed with respect to the PZT film 8, which had been formed by the process for the first time, and the PZT film 8 was coated with the PZT precursor solution 5 by the liquid droplet coating apparatus shown in FIG. 3. Subsequently, the heating process was performed similar to the process for the first time, and thereby the recoated PZT film 8 shown in FIG. 2I was obtained. At this time, the film thickness was 180 nm. The PZT precursor film 7 having the film thickness of 540 nm was obtained by repeating the above-described process six times. Subsequently, a crystallization heat treatment (at 700 degrees Celsius) was performed in a rapid heat treatment. No defects such as cracks were found in the PZT film 8. Additionally, after repeating the SAM film forming process six times, the PZT precursor solution 5 was selectively applied. Subsequently, a drying process at 120 degrees Celsius, a thermal decomposing process at 500 degrees Celsius, and a crystallizing process were performed. As a result, no defects such as cracks were found in the PZT film 8. At this time, the film thickness was 1000 nm.

Figure 4:
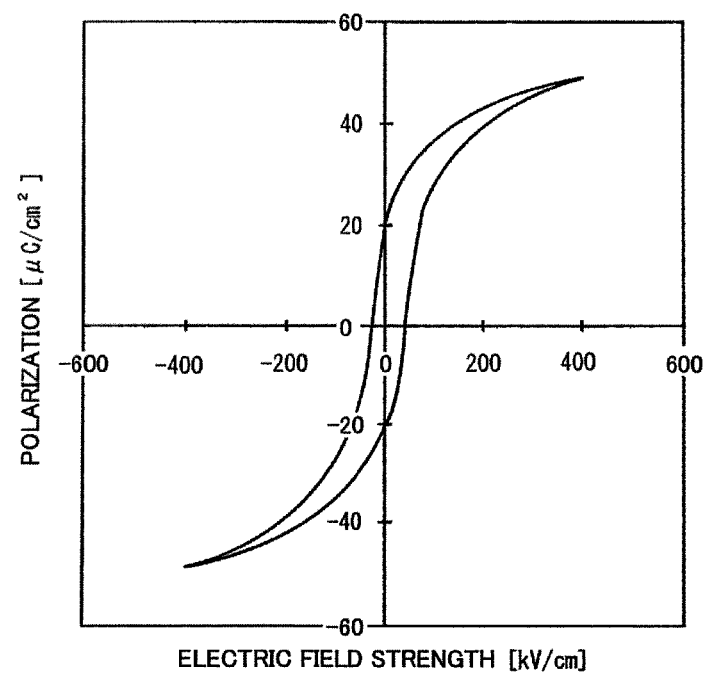
FIG. 4 is a diagram showing a P-E hysteresis loop of the electromechanical transducer element according to the first embodiment.

The electromechanical transducer element (piezoelectric element) was obtained by patterning the PZT film 8, which had been finalized and which had the film thickness of 1000 nm, and forming the upper electrode (platinum) as the second electrode on the PZT film 8. After that, the electric property and electromechanical transducing capability (piezoelectric constant) were evaluated. The PZT film 8 was found to have a relative permittivity of 1220, a dielectric loss of 0.02, a residual polarization of 19.3 $\mu C/cm^2$, and a coercive electric field of 36.5 kV/cm. Namely, the PZT film 8 was found to have the electric property which was equivalent to an electric property of a usual ceramics sintered body. FIG. 4 shows a P-E hysteresis loop which was obtained in this case.

The electromechanical transducing capability was calculated by measuring a displacement amount caused by application of an electric field using a laser doppler vibrometer and fitting the simulation result with the measurement result. The piezoelectric constant $d_{31}$ was 120 pm/V, which was equivalent to the piezoelectric constant of the ceramics sintered body. These characteristic values are sufficient for designing a liquid discharge head.

Figure 5:
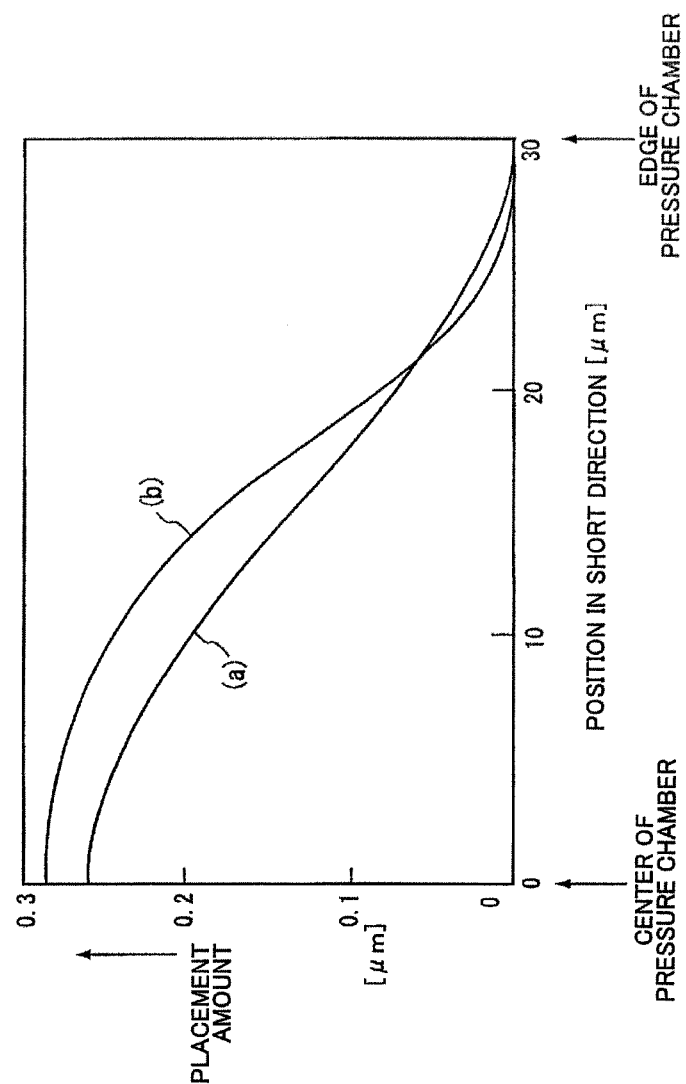
FIG. 5 is a graph indicating a measurement result of a displacement amount of the electromechanical transducer element according to the first embodiment.

Dimensions of the pattern of the finally formed PZT film 8 according the first embodiment were 1000 μm×50 μm. FIG. 5 shows a result of measuring a displacement amount in a short width direction (short direction, which corresponds to a sub-scanning direction) of the PZT film 8 by a laser Doppler meter. In FIG. 5, the horizontal axis indicates a position in the short direction in an actuator portion (described later, cf. FIGS. 6B and 9) of the electromechanical transducer element, and the vertical axis indicates a displacement amount of the actuator portion. In FIG. 5, (a) is a graph indicating a displacement characteristic of a comparative example. Specifically, (a) shows the displacement characteristic of an actuator portion of an electromechanical transducer element including a PZT film. Here, the PZT film has been patterned to have dimensions which are the same as those of the finally formed PZT film 8 according to the first embodiment, and the PZT film has been formed by the spin coating method. In FIG. 5, (b) shows a displacement characteristic of the actuator portion of the electromechanical transducer element including the finally formed PZT film 8, which has been formed by the inkjet method according to the first embodiment.

Figure 6:
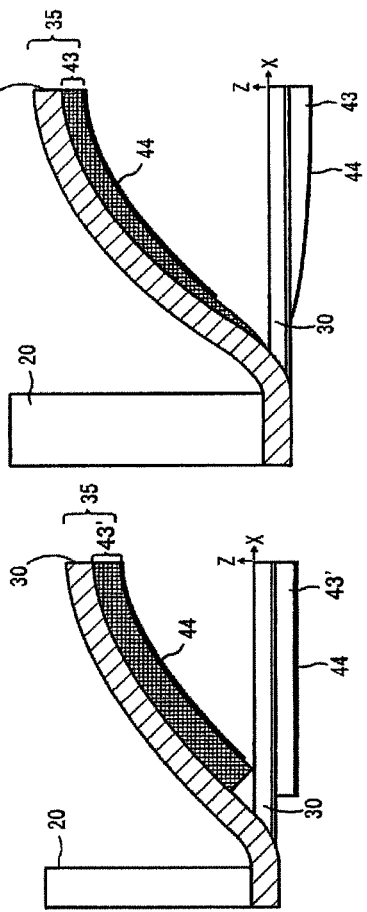
FIG. 6A is a diagram illustrating deformation of a half side of an actuator unit of an electromechanical transducer element according to a comparative example, which has been formed by a spin coating method.
FIG. 6B is a diagram illustrating deformation of a half side of an actuator unit of the electromechanical transducer element according to the first embodiment, which has been formed by an inkjet method.

Referring to FIGS. 6A and 6B, there will be explained deformation of a PZT film 43 (electromechanical transducer film) of the actuator portion 35 of the electromechanical transducer element according to the first embodiment, while comparing the deformation of the PZT film 43 according to the first embodiment with that of the comparative example. FIG. 6A shows a half portion of a deformed PZT film 43'. The PZT film 43' is similar to that of the comparative example, which has been explained by referring to FIG. 5A. The PZT film 43' has been formed by the spin coating method. FIG. 6B shows a half portion of the deformed PZT film 43 according to the first embodiment. The PZT film 43 is the same as the PZT film 8 which has been explained by referring to FIG. 5B. The PZT film 43 has been formed by the inkjet method. In FIGS. 6A and 6B, the scale in the vertical direction is magnified 50 times, so that a difference between the deformation of the PZT film 43' according to the comparative example and the deformation of the PZT film 43 according to the first embodiment can be easily found.

Figure 9:
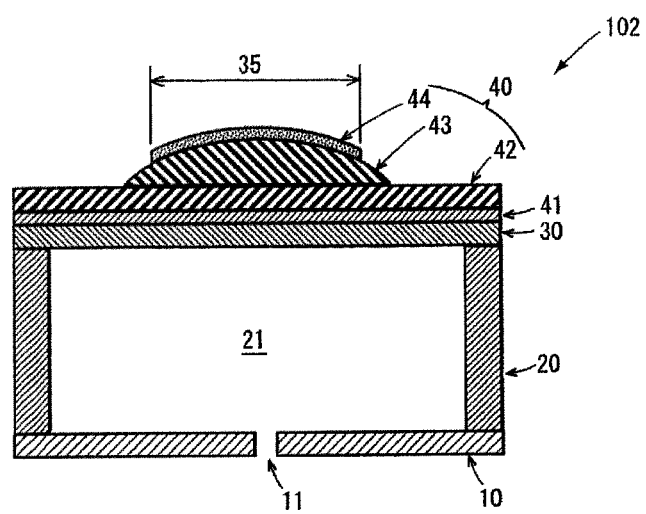
FIG. 9 is a schematic cross-sectional view of a single-nozzle inkjet head according to a third embodiment of the present invention.

The white figures shown in the bottom sides of FIGS. 6A and 6B indicate cross-sectional shapes of actuator portions 35 of the corresponding electromechanical transducer elements, where voltages are not applied to the actuator portions 35. Referring to FIG. 9, the actuator portion 35 is a laminated structure portion which is formed by sandwiching an electromechanical transducer film 43 between an oscillation plate 30 and an upper electrode 44. Here, the oscillation plate 30 corresponds to the substrate 1, and the electromechanical transducer film 43 corresponds to the PZT film 43. The actuator portion 35 is a moving part that actually deforms when a voltage is applied. Further, in FIG. 6A, the X-axis indicates a position in the PZT film 43' in the short direction (the sub-scanning direction). Similarly, in FIG. 6B, the X-axis indicates a position in the PZT film 43 in the short direction (the sub-scanning direction). In each of FIGS. 6A and 6B, the Z-axis indicates a position and a displacement amount of the actuator portion 35 toward a pressure chamber substrate 20 and a pressure chamber 21 (cf., FIG. 9), when a voltage is applied to the actuator portion 35. Since the PZT film 43' according to the comparative example has been processed by etching, the film thickness of the PZT film 43' according to the comparative example is substantially uniform. Here, the PZT film 43' according to the comparative example is shown in FIG. 6A, and it has been manufactured by the spin coating method. Therefore, the stiffness of the PZT film 43' according to the comparative example is substantially constant irrespective of a position in the PZT film 43'. It can be found from FIG. 6A that the PZT film 43' according to the comparative example hinders deformation of the oscillation plate 3 in the vicinity of the edge portion of the PZT film 43'.

On the other hand, a cross-section (indicated by the white figure) of the PZT film 43, which is shown in FIG. 6B and which has been formed by the inkjet method according to the first embodiment, has a shape of a meniscus convex lens (a crescent-shape) (the convex portion is directed toward the upper electrode 44). Since the film thickness is small at the edge portion of the PZT film 43, the stiffness of the actuator portion 35 (the PZT film 43) is lowered in the vicinity of the edge portion. Therefore, during deformation, the oscillation plate 30 greatly deforms in the vicinity of the edge portion, compared to the case of the spin coating method. Further, the maximum displacement amount of the PZT film 43 at the center portion is greater than that of the PZT film 43' based on the spin coating method. It has been found that this result agrees with the measurement result shown in FIG. 5.

Further, thickening of the film was attempted without disposing the upper electrode. Namely, the crystallizing process was performed for every six times of thermal decomposition and annealing, and this process was repeated ten times. Then, a patterned PZT film having a thickness of 5 μm was obtained without any defects such as cracks.

As described above, the actuator portion 35, which is formed by laminating layers from the oscillation plate 30 (the substrate) to the upper electrode 44 (the second electrode), of the electromechanical transducer element that has been obtained in the first embodiment has a stiffness such that, in the cross-section of the actuator portion 35 in the short direction (corresponding to the sub-scanning direction) which is perpendicular to the longitudinal direction, the stiffness gradually increases from the end portion of the actuator portion 35 to the center portion of the actuator portion 35. In this case, the stiffness may vary in accordance with a mountain shaped curve having a peak value at the center, or the stiffness may vary in accordance with a triangular curve having a peak value at the center. Specifically, it is preferable that the actuator portion 35 be manufactured such that, in the cross-section of the actuator portion 35 in the short direction, the stiffness of the actuator portion 35 gradually increases from the end portion of the actuator portion 35 to the center portion of the actuator portion 35 along a curved line of an outer periphery of a shape of a meniscus convex lens.

As described above, according to the first embodiment, the electromechanical transducer element having a specific stiffness characteristic can be obtained. The electromechanical transducer element has efficient electromechanical transducing capability, and with the electromechanical transducer element, excellent displacement can be realized. Further, the method of producing the electromechanical transducer film includes a surface modification process of partially modifying the surface of the first electrode; a coating process of partially coating the modified surface of the first electrode with the sol-gel liquid (the PZT precursor solution) including the PZT precursors as the precursors of the piezoelectric materials; and a drying/thermally decomposing/crystallizing process for drying, thermally decomposing, and crystallizing the partially applied sol-gel liquid. Further, the method of producing the electromechanical transducer film includes the process of obtaining the patterned electromechanical transducer film by repeating the coating process and the drying/thermally decomposing/crystallizing process. Here, the surface modification process includes a process of applying a thiol compound to the surface of the first electrode, and a subsequent process of partially removing the thiol compound by the photography/etching. Therefore, the process can be shortened by omitting the bank forming process described in Patent Document 6. Further, it is possible to prevent the occurrence of cracks in the drying/thermally decomposing/crystallizing process. Furthermore, according to the above-described process, the electromechanical transducer film (the PZT film) having an excellent electric property can be obtained.

Second Embodiment

Figure 7:
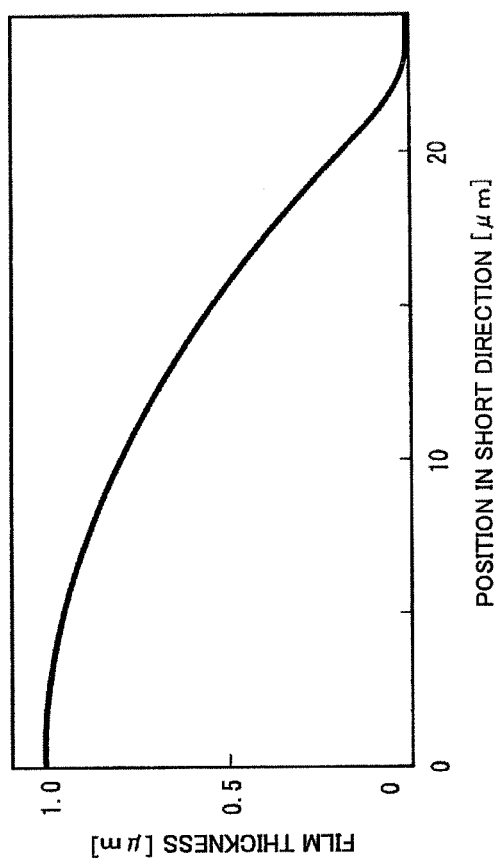
FIG. 7 is a graph indicating a film thickness distribution of a PZT film according to a second embodiment of the present invention.
Figure 8:
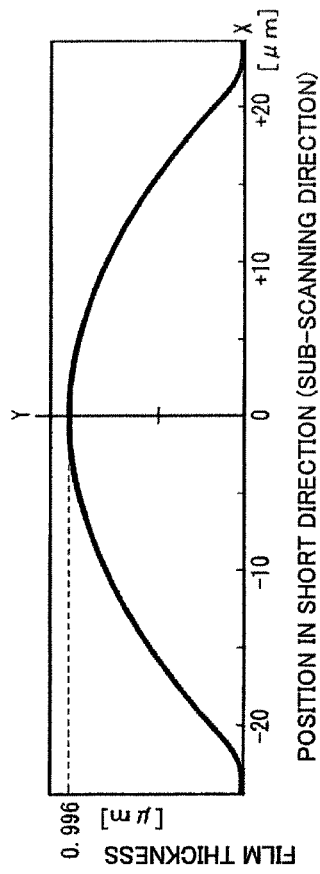
FIG. 8 is a diagram indicating a graph and expressions that illustrate an example of a shape of the film thickness distribution of the PZT film according to the second embodiment.

A second embodiment of the present invention relates to a shape of a film thickness distribution of the electromechanical transducer film and an outer peripheral surface shape of the electromechanical transducer film. Hereinafter, there will be explained the shape of the film thickness distribution and the outer peripheral surface shape of the PZT film according to the second embodiment by referring to FIGS. 7 and 8. FIG. 7 shows a measurement result of measuring the film thickness of the PZT film in the cross-section of the PZT film in the short direction of the actuator portion. Similar to the case of the first embodiment, the PZT film was finally obtained by applying the PZT precursor solution several times by the inkjet method. The film thickness was measured by a surface roughness tester. FIG. 7 shows the measurement result corresponding to a half portion of the PZT film. The film thickness of the PZT film is such that the maximum value of the thickness is achieved at the center portion of the PZT film, and the thickness uniformly decreases along a direction toward the end portion of the PZT film. At this time, the maximum value of the thickness at the center portion of the PZT film was 1000 nm (1.0 μm). Namely, the shape of the film thickness distribution of the PZT film has a shape characteristic such that, in the cross-section of the PZT film in the short direction of the actuator portion, the film thickness gradually increases from the end portion of the actuator portion to the center portion of the actuator portion. The shape of the film thickness distribution of the PZT film is substantially a shape of the meniscus convex lens.

Polynomial approximation was performed for the film thickness distribution of the PZT film. It has been found that the film thickness distribution agrees well with fourth order functions indicated by expressions (1) and (2) below (also shown in FIG. 8), which are higher-order functions. In the example of the film thickness distribution shown in FIG. 8, the width in the short direction (the sub-scanning direction, the positive direction and the negative direction of the X-axis) of the PZT film is 50 μm, and an effective range of X (the portion where the PZT film has been formed) is −25 μm≤X≤+25 μm. In the expression (1), X represents a coordinate position in the X-axis direction of a point on the PZT film with respect to the center of the cross section of the PZT film (namely, X=0 at the center of the cross section). Further, in the expression (1), Y represents a film thickness of the PZT film at a point on the PZT film which has a value X as a coordinate position in the X-axis direction (cf. FIG. 8). Coefficients A-E are values that vary depending on the film thickness.

$$Y = -AX^4 + BX^3 - CX^2 + DX + E \qquad \text{Expression (1)}$$

In order to obtain the expression (1), the film thickness measurement was performed many times, and the polynomial approximation for the film thickness distribution was performed many times. As a result, a specific relationship among the coefficients A-E has been found. Note that, in the expression (1), the coefficient E represents the film thickness at the center of the cross-section of the PZT film (the film thickness at the point where X=0). The coefficients A-E are in the specific relationship such that, when the coefficient E is in a range from 0.5 μm to 5.0 μm, the coefficients A, B, C, and D are within corresponding ranges where corresponding coefficients in the expression (2) below are multiplied by a factor in a range from 0.9 to 1.1.

$$Y=-3\times10^{18}X^4+10^{14}X^3-3\times10^9X^2+4520X+0.996 \quad \text{Expression (2)}$$

Namely, if $0.5\leq E\leq 5.0$, then $0.9\times 3\times 10^{18}\leq A\leq 1.1\times 3\times 10^{18}$, $0.9\times 10^{14}\leq B\leq 1.1\times 10^{14}$, $0.9\times 3\times 10^9\leq C\leq 1.1\times 3\times 10^9$, and $0.9\times 4520\leq D\leq 1.1\times 4520$.

From another point of view, it can be said that the expressions (1) and (2) are approximately expressing the outer peripheral surface shape of the PZT film.

As explained above, in the second embodiment, an idealistic shape of the film thickness distribution of the PZT film and an idealistic outer peripheral surface shape of the PZT film were obtained, in addition to the effects of the first embodiment. The conventional techniques of forming electromechanical transducer elements have been focused on uniformly forming an electromechanical transducer film such as a piezoelectric material included in an electromechanical transducer element, so that an efficient oscillation property and an efficient deformation property can be obtained. In view of this circumstance, the inventors propose the above described correlation between the stiffness of the electromechanical transducer element/film and the film thickness/shape for obtaining an efficient deformation property, from a fundamentally different view point/concept.

Third Embodiment

Figure 10:
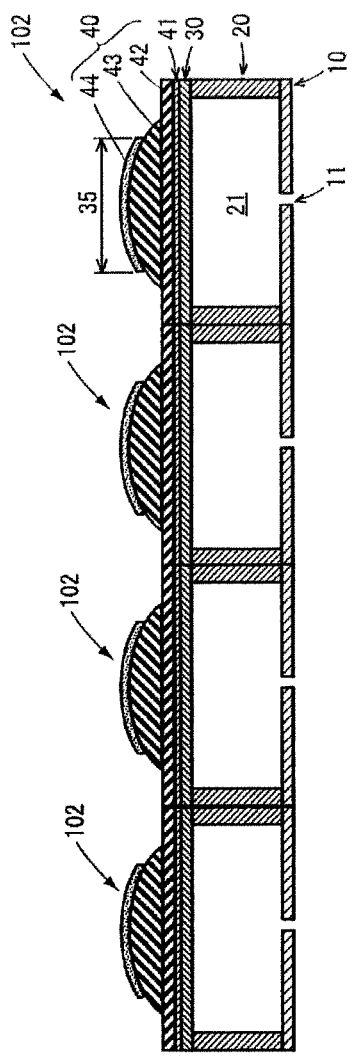
FIG. 10 is a schematic cross-sectional view of an example of a configuration according to the third embodiment in which plural inkjet heads are arranged.

A third embodiment relates to the liquid discharge head. Hereinafter, there will be explained an inkjet head 102, as an example of the liquid discharge head, by referring to FIGS. 9 and 10. FIG. 9 is a schematic cross-sectional view (end view) of a single-nozzle inkjet head. FIG. 10 is a schematic cross-sectional view (end view) of an example of a configuration where plural inkjet heads are arranged. Here, for the sake of simplicity of the figures, a liquid supply unit, a fluid channel, and a fluid resistance are not shown in FIGS. 9 and 10.

An inkjet head 102 shown in FIG. 9 includes the electromechanical transducer element 40 which includes the electromechanical transducer film 43 that has been produced by the method according to the embodiment 1. The inkjet head 102 includes a nozzle 11 that is formed in a nozzle plate 10 and that is for discharging ink droplets; a pressure chamber 21 that is also referred to as the liquid chamber and that communicates with the nozzle 11; and the electromechanical transducer element 40 that is a pressure generating unit for discharge ink (not shown) inside the pressure chamber 21. The pressure chamber 21 is formed as a space by arranging pressure chamber substrates 20 formed of Si substrates on the nozzle plate 10.

The electromechanical transducer element 40 is disposed to face the nozzle plate 10. The electromechanical transducer element 40 is a piezoelectric element that is for discharging the ink inside the pressure chamber 21 as ink droplets from the nozzle 11 by causing an oscillation plate 30 to be deformed. Here, the oscillation plate 30 forms a wall surface of the pressure chamber 21. In the electromechanical transducer element 40, an adhesive layer 41 (also referred to as an oxide electrode) is formed on the oscillation plate 30 formed of a Si substrate, and a lower electrode (a platinum group electrode) 42, which is to be a first electrode, is formed on the adhesive layer 41. The electromechanical transducer film 43 is formed on the lower electrode 42, and an upper electrode 44, which is to be a second electrode, is formed on the electromechanical transducer film 43. Namely, the electromechanical transducer film 43 is disposed (sandwiched) between the lower electrode 42 (the first electrode) and the upper electrode 44 (the second electrode).

The actuator portion 35 is a moving part that actually deforms when a voltage is applied between the lower electrode 42 and the upper electrode 44. The actuator portion 35 is a laminated structure portion from the oscillation plate 30 as the substrate 1 (which has been explained in the first embodiment) to the upper plate 44. The laminated structure has been formed by sandwiching the PZT film (as the electromechanical transducer film 43) between the oscillation plate 30 and the upper electrode 44. As explained in the first and second embodiments, the actuator portion 35 has the stiffness and the film thickness such that, in the cross-section of the actuator portion 35 in the short direction, the stiffness and the film thickness gradually increase from the end portion of the actuator portion 35 to the center portion of the actuator portion 35. Specifically, the actuator portion 35 has a shape substantially of a meniscus convex lens, where the convex portion directed toward the upper electrode 44.

According to the third embodiment, the electromechanical transducer element 40 having the performance that is equivalent to the performance of a bulk ceramic can be formed by a simple manufacturing process. The inkjet head 102 as the example of the liquid discharge head can be formed by subsequently performing etching removal from the rear side of the oscillation plate 30 for forming the pressure chamber 21, and adhering the nozzle plate 10 having the nozzle 11 to the pressure chamber substrates 20.

In the third embodiment, the inkjet head 102 (as an example of the liquid discharge head) has been explained as an example case where the electromechanical transducer element 40 is utilized. However, usage of the liquid discharge head including the electromechanical transducer element 40 is not limited to this. For example, the liquid discharge head including the electromechanical transducer element 40 may also be applied to any of a micropump, an ultrasonic motor, an acceleration sensor, a two-axis scanner for a projector, and an infusion pump.

Fourth Embodiment

Figure 11:
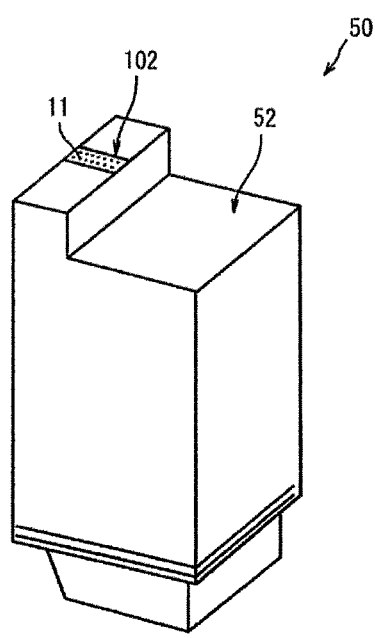
FIG. 11 is a perspective view illustrating an external appearance of an inkjet cartridge according to a fourth embodiment of the present invention.

A fourth embodiment relates to a liquid droplet discharge device. Hereinafter, there will be explained an ink cartridge 50, as an example of the liquid droplet discharge device, by referring to FIG. 11. FIG. 11 is a perspective view showing an external appearance of the ink cartridge 50. The ink cartridge 50 has been formed by integrating the inkjet head 102 according to the third embodiment which includes the nozzle 11 and an ink tank 52 that stores ink to be supplied to the inkjet head 102.

According to the fourth embodiment, the ink tank 52 and the inkjet head 102 are integrated in the ink cartridge 50. The reduction of the cost of the inkjet head 102 is directly linked to the reduction of the cost of the whole ink cartridge 50. Therefore, the cost can be reduced for the ink cartridge 50 in which the inkjet head 102 has been integrated.

Fifth Embodiment

Figure 12:
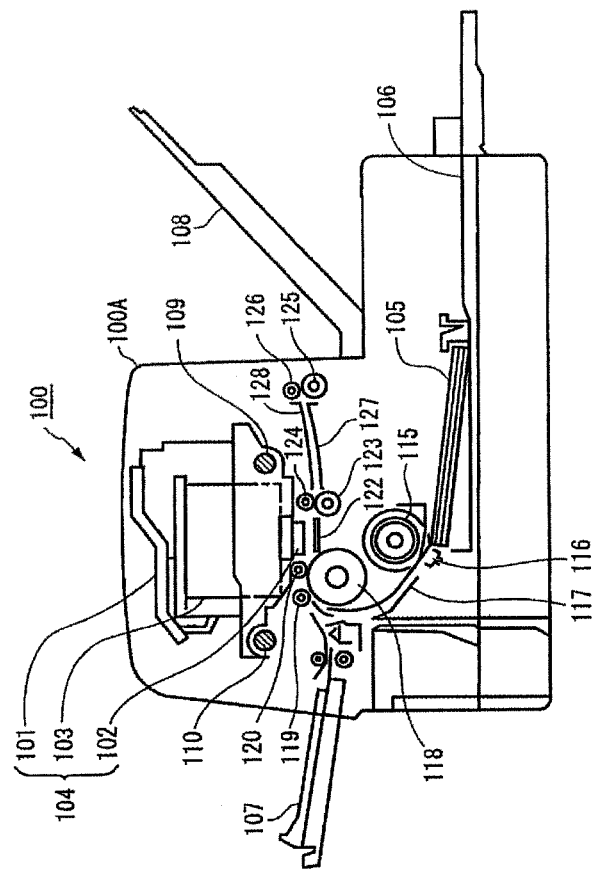
FIG. 12 is a schematic partial cross-sectional front view of mechanical elements of an inkjet recording apparatus according to a fifth embodiment of the present invention.
Figure 13:
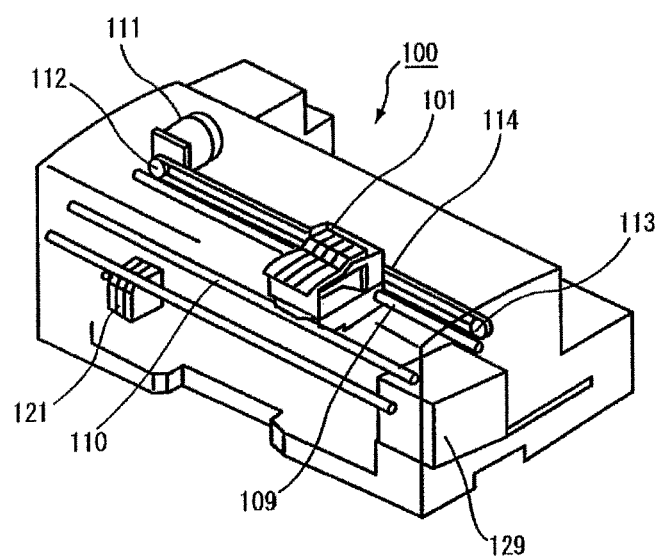
FIG. 13 is a schematic perspective view in which major elements of the inkjet recording apparatus of FIG. 12 are visualized.

A fifth embodiment relates to an image forming apparatus. Hereinafter, there will be explained an overall configuration of an inkjet recording apparatus 100, as an example of the image forming apparatus, by referring to FIGS. 12 and 13. FIG. 12 is a schematic partial cross-sectional front view of mechanical portions of the inkjet recording apparatus 100 according to the fifth embodiment. FIG. 13 is a perspective view visualizing major portions of the inkjet recording apparatus 100.

The inkjet recording apparatus 100 shown in FIGS. 12 and 13 includes the inkjet head 102 (hereinafter, simply referred to as the recording head 102) according to the third embodiment. The recording head 102 is an example of the liquid discharge head. As shown in FIGS. 12 and 13, the inkjet recording apparatus 100 is a so-called "serial inkjet recording apparatus." A recording apparatus main body 100A includes a printing unit 104, which is disposed inside the recording apparatus main body 100A. The printing unit 104 includes a carriage 101 which is moveable in the main scanning direction; recording heads 102 disposed at a lower side of the carriage 101; and ink cartridges 103 for supplying ink to the corresponding recording heads 102.

A sheet feeding cassette 106 is disposed at a bottom portion of the recording apparatus main body 100A. A large number of sheets of recording paper 105 can be stacked on the sheet feeding cassette 106. The sheets of the recording paper 105 can be placed on the sheet feeding cassette 106 from a front side of the recording apparatus main body 100A, which is the left side in FIG. 13. The sheet feeding cassette 106 can be pulled out from and pushed into the recording apparatus main body 100A. The recording device main body 100A includes a manual feed tray 107 for manually feeding sheets of the recording paper 105. The manual feed tray 107 is disposed above the sheet feeding cassette 106. The manual feed tray 107 is openable and closeable with respect to the recording device main body 100A. The inkjet recording apparatus 100 takes in the sheet of the recording paper 105 fed from the paper feed cassette 106 or the manual feed tray 107. After a desired image has been printed onto the sheet of the recording paper 105 by the printing unit 104, the inkjet recording apparatus 100 discharges the sheet of the recording paper 105 onto a paper discharge tray 108 attached to a rear surface side of the inkjet recording apparatus 100.

In the printing unit 104, the carriage 101 is supported by a main guide rod 109 and a sub guide rod 110, so that the carriage 101 can be slid in the main scanning direction. The main guide rod 109 and the sub guide rod 110 are horizontally supported by left and right side plates (not shown). The recording heads 102 are attached to the carriage 101. Here, the recording heads 102 discharge corresponding yellow (Y) ink droplets, cyan (C) ink droplets, magenta (M) ink droplets, and black (Bk) ink droplets, respectively. Plural ink discharge ports (nozzles) of the recording heads 102 are arranged in a direction intersecting the main scanning direction. The recording heads 102 are attached to the carriage 101 so that the ink discharging direction is directed downward.

Ink cartridges 103 corresponding to yellow, cyan, magenta, and black, respectively, are exchangeably attached to the carriage 101. The ink cartridges 103 are for supplying the yellow ink, the cyan ink, the magenta ink, and the black ink, respectively, to the corresponding recording heads 102. Each of the ink cartridges 103 includes an air inlet that communicates with the outside air; a supply port for supplying the corresponding ink to the recording head 102; and a porous body filled with the corresponding ink. Here, the air inlet is arranged at an upper portion of the ink cartridge 103, the supply port is arranged at a lower portion of the ink cartridge 103, and the porous body is disposed inside the ink cartridge 103. The pressure of the ink supplied to the recording heads 102 is kept slightly negative by the capillary force of the porous body. Here, the recording heads 102 corresponding to yellow, cyan, magenta, and black are utilized. However, a single head including nozzles for discharging corresponding colors of ink may be utilized. A rear side of the carriage 101 (downstream side in the recording paper conveyance direction) is slidably supported by the main guide rod 109, and a front side of the carriage 101 (upstream side in the recording paper conveyance direction) is slidably placed on the sub guide rod 110. A timing belt 114 is fixed to the carriage 101, so that the carriage 101 can be moved and can scan in the main scanning direction. The timing belt 114 is wound around a drive pully 112 and a driven pully 113. The drive pully 112 is rotationally driven by a main scanning motor 111. The carriage 101 can be reciprocated by the forward and reverse rotations of the main scanning motor 111.

On the other hand, the inkjet recording apparatus 100 includes a paper feeding roller 115 and a friction pad 116 for feeding the sheets of the recording paper 105 from the paper feed cassette 106 and for separating the sheets of the recording paper 105; a guide member 117 for guiding the sheet of the recording paper 105; a conveyance roller 118 that inverts the sheet of the recording paper 105 being fed and conveys the sheet of the recording paper 105; a pressing roller 119 that is pressed to a peripheral surface of the conveyance roller 118; and a top end roller 120 that defines an angle of sending the sheet of the recording paper 105 from the conveyance roller 168, so as to convey the sheet of the recording paper 105 being set in the paper feed cassette 106 to an area below the recording heads 102.

The conveyance roller 118 is rotationally driven by a sub-scanning motor (not shown) through a sequence of gears. Further, a print support member 122 for guiding the sheet of the recording paper 105 sent out from the conveyance roller 118 at the area below the recording heads 102 is provided. The length of the print support member 122 corresponds to a moving range in the main scanning direction of the carriage 101. At the downstream side in the recording paper conveyance direction of the printing support member 122, the inkjet recording apparatus 100 further includes a conveyance roller 123 and a spur 124 that are rotationally driven so as to send the sheet of the recording paper 105 in a paper discharging direction; a paper eject roller 125 and a spur 126 for sending the sheet of the recording paper 105 onto the paper discharge tray 108; and guide members 127 and 128 that form a paper ejection path.

When the inkjet recording apparatus 100 prints an image, the inkjet recording apparatus 100 drives the recording heads 102, while moving the carriage 101. In this manner, the recording heads 102 discharge ink onto the sheet of the recording paper 105, which remains stationary, and thereby printing corresponding to one line is completed. Subsequently, the inkjet recording apparatus 100 prints the next line, after moving the sheet of recording paper 105 by a predetermined distance. When the inkjet recording apparatus 100 receives a printing termination signal or a signal indicating that the end of the sheet of the recording paper 105 has reached the printing area, the inkjet recording apparatus 100 terminates the printing operation and ejects the sheet of the recording paper 105. Further, the inkjet recording apparatus 100 includes a recovering device 129 for recovering a discharge failure of the recording heads 102. The recovering device 129 is disposed at a position outside the printing area. Here, the position is at a rightmost side in a direction in which the carriage 101 moves. The recovering device 129 includes a cap unit, a suction unit, and a cleaning unit. During the print waiting state, the carriage 101 is moved to the side of the recovering device 129, and the recording heads 102 are capped by the cap unit. In this manner, the wet conditions of the discharging ports are maintained, and a discharge failure caused by ink drying is prevented. Additionally, during printing, the inkjet recording apparatus 100 causes the recording heads 102 to discharge ink that is not related to the recording. In this manner ink viscosities at all the discharging ports are kept constant, and a stable discharging performance is maintained.

When a discharge failure occurs, the inkjet recording apparatus 100 causes the cap unit to seal the discharging ports (nozzles) of the recording heads 102. Then, the suction unit suctions babbles along with the ink from the discharging ports through a tube. The cleaning unit removes the ink or dust attached to a surface of the discharging ports. In this manner, the discharge failure is recovered. The suctioned ink is discharged to a waste ink reservoir (not shown) disposed at a lower portion of the recording apparatus main body 100A, and an ink absorber in the waste ink reservoir absorbs and reserves the suctioned ink.

As described above, since the inkjet recording apparatus 100 according to the fifth embodiment includes the recording heads 102, an ink discharging failure caused by a failure for driving the oscillation plate 30 is prevented. Therefore, a stable ink discharging characteristic is obtained and the quality of the image is improved.

Hereinabove, the electromechanical transducer element, the liquid discharge head, the liquid droplet discharge device, and the image forming apparatus have been explained by the embodiments. However, the present invention is not limited to the above-described embodiments, and various modifications and improvements may be made within the scope of the present invention.

In the third embodiment, the inkjet head 102 that discharges infinitesimal ink droplets has been exemplified and explained as the liquid discharge head including the electromechanical transducer element 40. However, the third embodiment is not limited to this. The liquid discharge head may be a liquid discharge head that discharges infinitesimal liquid droplets of an arbitrary liquid that is used for a corresponding purpose, instead of the ink. Further, the liquid discharge head may be applied to a patterning apparatus for which a liquid discharge head is utilized.

The electromechanical transducer element is not limited to those described in the first embodiment through the third embodiment. For example, the electromechanical transducer element may be an electromechanical transducer element including a first electrode formed on a substrate; an electromechanical transducer film formed, at least, on a portion of the first electrode; a second electrode formed, at least, on a portion of the electromechanical transducer film, wherein an actuator portion that is formed by laminating layers from the substrate to the second electrode has a stiffness such that, in a cross-section of the actuator portion, the stiffness gradually increases from an end portion of the actuator portion to the center portion of the actuator portion. Namely, the electromechanical transducer element is not limited to an electromechanical transducer element that has been obtained by the sol-gel method such as explained in the first embodiment, and it suffices when an actuator portion of an electromechanical transducer element has the above-described stiffness characteristic. Specifically, it is preferable that the actuator portion be formed such that, in the cross-section of the actuator portion, the stiffness of the actuator portion gradually increases from the end portion of the actuator portion to the center portion of the actuator portion, substantially along a curved line of an outer periphery of a shape of a meniscus convex lens.

The image forming apparatus is not limited to the inkjet recording apparatus 100 shown in FIGS. 12 and 13. The image forming apparatus may be an inkjet image forming apparatus, such as a printer, a plotter, a word processor, a facsimile machine, a copy machine, and a multifunction peripheral having two or more of these functions. The technical field of the present invention may be directly related to a field of printing technology. Especially, a field of digital printing technology can be considered. Examples of the image forming apparatus include a digital printing apparatus that utilizes a multifunction printer (MFP), a printer that is used in an office environment or in a personal environment, a MFP, and the like. Application fields of the present invention include, for example, a field of three-dimensional molding technology in which the inkjet technique is utilized. Further, the recording medium and the sheet are not limited to the sheet of the recording paper 105. Examples of the recording medium and the sheet include all types of recording media and sheets on which images can be formed by using the inkjet head, such as a sheet of paper whose thickness is in a range from a thickness of a usable thin paper to a thickness of a usable thick paper, a postcard, an envelope, a transparency, and the like.

The present application is based on Japanese Priority Application No. 2012-002524 filed on Jan. 10, 2012, the entire contents of which are hereby incorporated herein by reference.

What is claimed is:

1. An electromechanical transducer element comprising:
a first electrode disposed on a substrate;
an electromechanical transducer film disposed on a first portion of the first electrode; and
a second electrode disposed on a second portion of the electromechanical transducer film,
wherein an actuator portion formed by laminating the substrate, the first electrode, the electromechanical transducer film, and the second electrode has a stiffness such that, in a cross section of the actuator portion, the stiffness gradually increases from an end portion of the actuator portion to a center portion of the actuator portion, and
wherein the cross section of the actuator portion has a shape of a meniscus convex lens,
wherein the electromechanical transducer film has a film thickness such that, in the cross section of the actuator portion, the film thickness gradually increases from the end portion of the actuator portion to the center portion of the actuator portion,
wherein a shape of a film thickness distribution in the cross section of the actuator portion is approximated by a fourth order function $Y=-AX^4+BX^3-CX^2+DX+E$,
wherein, in the fourth order function, the X represents a coordinate position toward one of edges of the electromechanical transducer film with respect to the center portion of the actuator portion, wherein the X is equal to zero at the center portion of the actuator portion, and
wherein, in the fourth order function, the Y represents the film thickness at a point where the coordinate position is equal to the X.

2. The electromechanical transducer element according to claim 1,
wherein, in the fourth order function, the A, the B, the C, and the D are coefficients whose values vary depending on the film thickness,
wherein, at the center portion of the actuator portion, the film thickness is equal to the E, and
wherein, when the E is in a range from 0.5 to 5.0, the A is in a first range from $0.9 \times 3 \times 10^{18}$ to $1.1 \times 3 \times 10^{18}$, the B is in a second range from $0.9 \times 10^{14}$ to $1 \times 10^{14}$, the C is in a third range from $0.9\times3\times10^9$ to $1.1\times3\times10^9$, and the D is in a fourth range from $0.9\times4520$ to $1.1\times4520$.

3. The electromechanical transducer element according to claim 1,
wherein the electromechanical transducer film is formed by an electromechanical transducer film producing method that includes
a surface modification process of partially modifying a surface of the first electrode; and
a coating process of partially coating the modified surface of the first electrode with a sol-gel liquid including a piezoelectric material precursor by a liquid droplet discharge method;
wherein after the coating process, a drying process and a thermal decomposing process is executed and repeated a plurality of times, and a crystallizing process is executed once for said plurality of times, and
wherein, in the electromechanical transducer film producing method, the patterned electromechanical transducer film is obtained by repeating the coating process, the drying process and the thermal decomposing process the plurality of times, and by performing the crystallizing process once for said plurality of times in which the drying process and the thermal decomposing process the plurality of times are repeated.

4. The electromechanical transducer element according to claim 3,
wherein the surface modification process includes a process in which a thiol compound is applied to the surface of the first electrode and subsequently the thiol compound is partially removed by photolithography and etching.

5. A liquid discharge head including an electromechanical transducer element, the electromechanical transducer element comprising:
a first electrode disposed on a substrate;
an electromechanical transducer film disposed on a first portion of the first electrode; and
a second electrode disposed on a second portion of the electromechanical transducer film,
wherein an actuator portion formed by laminating the substrate, the first electrode, the electromechanical transducer film, and the second electrode has a stiffness such that, in a cross section of the actuator portion, the stiffness gradually increases from an end portion of the actuator portion to a center portion of the actuator portion, and
wherein the cross section of the actuator portion has a shape of a meniscus convex lens,
wherein the electromechanical transducer film has a film thickness such that, in the cross section of the actuator portion, the film thickness gradually increases from the end portion of the actuator portion to the center portion of the actuator portion,
wherein a shape of a film thickness distribution in the cross section of the actuator portion is approximated by a fourth order function $Y=-AX^4+BX^3-CX^2+DX+E$,
wherein, in the fourth order function, the X represents a coordinate position toward one of edges of the electromechanical transducer film with respect to the center portion of the actuator portion, wherein the X is equal to zero at the center portion of the actuator portion, and
wherein, in the fourth order function, the Y represents the film thickness at a point where the coordinate position is equal to the X.

6. A liquid droplet discharge device comprising:
a liquid discharge head; and
a tank configured to store a liquid to be supplied to the liquid discharge head,
wherein the liquid discharge head includes an electromechanical transducer element,
wherein the electromechanical transducer element includes
a first electrode disposed on a substrate;
an electromechanical transducer film disposed on a first portion of the first electrode; and
a second electrode disposed on a second portion of the electromechanical transducer film,
wherein an actuator portion formed by laminating the substrate, the first electrode, the electromechanical transducer film, and the second electrode has a stiffness such that, in a cross section of the actuator portion, the stiffness gradually increases from an end portion of the actuator portion to a center portion of the actuator portion, and
wherein the cross section of the actuator portion has a shape of a meniscus convex lens,
wherein the electromechanical transducer film has a film thickness such that, in the cross section of the actuator portion, the film thickness gradually increases from the end portion of the actuator portion to the center portion of the actuator portion,
wherein a shape of a film thickness distribution in the cross section of the actuator portion is approximated by a fourth order function $Y=-AX^4+BX^3-CX^2+DX+E$,
wherein, in the fourth order function, the X represents a coordinate position toward one of edges of the electromechanical transducer film with respect to the center portion of the actuator portion, wherein the X is equal to zero at the center portion of the actuator portion, and
wherein, in the fourth order function, the Y represents the film thickness at a point where the coordinate position is equal to the X.

7. An image forming apparatus comprising:
a liquid discharge head including an electromechanical transducer element,
wherein the electromechanical transducer element includes
a first electrode disposed on a substrate;
an electromechanical transducer film disposed on a first portion of the first electrode; and
a second electrode disposed on a second portion of the electromechanical transducer film,
wherein an actuator portion formed by laminating the substrate, the first electrode, the electromechanical transducer film, and the second electrode has a stiffness such that, in a cross section of the actuator portion, the stiffness gradually increases from an end portion of the actuator portion to a center portion of the actuator portion, and
wherein the cross section of the actuator portion has a shape of a meniscus convex lens,
wherein the electromechanical transducer film has a film thickness such that, in the cross section of the actuator portion, the film thickness gradually increases from the end portion of the actuator portion to the center portion of the actuator portion,
wherein a shape of a film thickness distribution in the cross section of the actuator portion is approximated by a fourth order function $Y=-AX^4+BX^3-CX^2+DX+E$,
wherein, in the fourth order function, the X represents a coordinate position toward one of edges of the electromechanical transducer film with respect to the center portion of the actuator portion, wherein the X is equal to zero at the center portion of the actuator portion, and wherein, in the fourth order function, the Y represents the film thickness at a point where the coordinate position is equal to the X.

* * * * *